United States Patent
Feng et al.

(10) Patent No.: US 11,302,750 B2
(45) Date of Patent: Apr. 12, 2022

(54) PIXEL STRUCTURE AND OLED DISPLAY PANEL

(71) Applicant: KUNSHAN GO-VISIONOX OPTO-ELECTRONICS CO., LTD., Kunshan (CN)

(72) Inventors: Dandan Feng, Kunshan (CN); Xiujian Zhu, Kunshan (CN); Xiaoxu Hu, Kunshan (CN)

(73) Assignee: KUNSHAN GO-VISIONOX OPTO-ELECTRONICS CO., LTD., Jiangsu (CN)

( * ) Notice: Subject to any disclaimer, the term of this patent is extended or adjusted under 35 U.S.C. 154(b) by 580 days.

(21) Appl. No.: 16/323,353

(22) PCT Filed: Jun. 8, 2018

(86) PCT No.: PCT/CN2018/090495
§ 371 (c)(1),
(2) Date: Mar. 7, 2019

(87) PCT Pub. No.: WO2019/041958
PCT Pub. Date: Mar. 7, 2019

(65) Prior Publication Data
US 2021/0359029 A1     Nov. 18, 2021

(30) Foreign Application Priority Data

Aug. 31, 2017    (CN) .......................... 201721111056.X

(51) Int. Cl.
*H01L 27/32*      (2006.01)
(52) U.S. Cl.
CPC .............................. *H01L 27/3218* (2013.01)

(58) Field of Classification Search
None
See application file for complete search history.

(56) References Cited

U.S. PATENT DOCUMENTS

2003/0007033 A1    1/2003  Ito et al.
2006/0103940 A1    5/2006  Lo et al.
(Continued)

FOREIGN PATENT DOCUMENTS

| CN | 103123927 A | 5/2013 |
| CN | 104319283 A | 1/2015 |

(Continued)

OTHER PUBLICATIONS

Extended European Search Report dated Aug. 5, 2020, including the Supplementary European Search Report and the European Search Opinion, in connection with corresponding EP Application No. 18851242.0 (8 pp.).

(Continued)

*Primary Examiner* — Hsien Ming Lee
(74) *Attorney, Agent, or Firm* — Maier & Maier, PLLC

(57) ABSTRACT

A pixel structure and an Organic Light-Emitting Diode (OLED) display panel. The pixel structure includes a number of pixel groups. Each of the pixel groups includes a first pixel and a second pixel adjacent in a first direction and disposed in a staggered manner in a second direction perpendicular to the first direction. Each of the first pixel and the second pixel includes sub-pixels of three different colors arranged along the second direction. A distance between two sub-pixels of a same color respectively of the first pixel and the second pixel in the first direction is equal to that in the second direction.

12 Claims, 9 Drawing Sheets

(56) References Cited

U.S. PATENT DOCUMENTS

| | | | |
|---|---|---|---|
| 2014/0198479 A1* | 7/2014 | Chao | H01L 27/3218 362/84 |
| 2015/0364526 A1 | 12/2015 | Peng et al. | |
| 2016/0293084 A1 | 10/2016 | Guo et al. | |

FOREIGN PATENT DOCUMENTS

| | | | | |
|---|---|---|---|---|
| CN | 104680948 A | | 6/2015 | |
| CN | 3214650 | * | 6/2017 | H01L 27/32 |
| CN | 207425858 U | | 5/2018 | |
| EP | 2 950 348 A1 | | 12/2015 | |
| EP | 3 346 498 A1 | | 7/2018 | |
| JP | 2008135333 A | | 6/2008 | |
| JP | 2016513334 A | | 5/2016 | |
| KR | 1020050048348 A | | 5/2005 | |
| KR | 10-0748310 B1 | | 8/2007 | |
| KR | 1020150107883 A | | 9/2015 | |
| KR | 1020160067086 A | | 6/2016 | |
| TW | 201431063 A | | 8/2014 | |
| WO | 2017/054614 A1 | | 4/2017 | |
| WO | 2014/114178 A1 | | 7/2017 | |

OTHER PUBLICATIONS

Japanese Office Action dated Jan. 19, 2021, in connection with corresponding JP Application No. 2019-563355 (6 pp., machine-generated English translation included).

International Search Report dated Aug. 17, 2018 in corresponding International application No. PCT/CN2018/090495; 6 pages including Partial English-language translation.

Korean Office Action dated Feb. 26, 2021, in connection with corresponding KR Application No. 10-2019-7032735 (13 pp., including machine-generated English translation).

* cited by examiner

PIXEL STRUCTURE AND OLED DISPLAY PANEL

TECHNICAL FIELD

This application relates to the field of display technologies, and in particular, to a pixel structure and an Organic Light-Emitting Diode (OLED) display panel including the pixel structure.

BACKGROUND

An Organic Light-Emitting Diode (OLED) is an active light-emitting device. Compared with a conventional Liquid Crystal Display (LCD) display, the OLED display technology does not need a backlight source and has a self-light-emitting properties. A relatively thin organic material film layer and a relatively thin glass substrate are used in an OLED. When a current passes through, the organic material film layer emits light. Therefore, an OLED display panel can significantly save electric energy, may be manufactured to be lighter and thinner, withstand a broader temperature variation range than an LCD display screen, as well as have a larger visible angle. The OLED display panel is expected to become a next-generation panel display technology after the LCD, and is one of the technologies that draw most attention among the current panel display technologies.

There are many OLED screen body colorization methods. Currently, an OLED colorization technology that is relatively mature and has been successfully mass-produced is an OLED evaporation technology. The OLED evaporation technology adopts a conventional RGB stripe arrangement manner is adopted for evaporation. A side-by-side arrangement has the best picture effect. In the side-by-side arrangement, there are three sub-pixels, namely, red, green, and blue (R, G, and B) sub-pixels, in a pixel range. Each of the sub-pixels is quadrilateral and has an independent organic light-emitting device. An organic light-emitting device is formed at a corresponding pixel position on an array substrate through a Fine Metal Mask (FMM) by using an evaporation film-forming, where the FMM is usually referred to as a metal mask or an evaporation mask for short. A technology for producing an OLED display panel with a high PPI (Pixel Per Inch, the number of pixels per inch) mainly focuses on a fine and mechanically stable FMM and pixel (sub-pixel) arrangement.

FIG. 1 is a schematic diagram of a pixel arrangement of an OLED display panel in the prior art. As shown in FIG. 1, a side-by-side pixel arrangement is used in the OLED display panel. Each pixel includes an R sub-pixel region 101, a G sub-pixel region 103, and a B sub-pixel region 105. Wherein the R sub-pixel region 101 includes an R light-emitting region 102 and an R non-light-emitting region (not numbered). The G sub-pixel region 103 includes a G light-emitting region 104 and a G non-light-emitting region (not numbered). The B sub-pixel region 105 includes a B light-emitting region 106 and a B non-light-emitting region (not numbered). Areas of the R, G, and B sub-pixel regions shown in FIG. 1 are respectively equal to areas of the light-emitting regions, and the R, G, and B sub-pixels are arranged in a straight line. Specifically, a light-emitting region of each sub-pixel region includes a cathode, an anode, and an electroluminescent layer (also referred to an organic emission layer). The electroluminescent layer is located between the cathode and the anode and configured to generate a light of a predetermined color to implement display. When a display panel in the prior art is prepared, it usually needs to perform an evaporation process for three times to separately form an electroluminescent layer of a corresponding color (red, green, or blue) in a light-emitting region of a pixel region of the corresponding color.

Usually, the FMM shown in FIG. 2 is used for evaporation in the OLED display panel shown in FIG. 1. Such an FMM includes a shielded region 107 and several evaporation opening 108. A shielded region between two adjacent evaporation openings 108 in a same column is referred to as a bridge (a connection bridge). To avoid generating a shielding effect on a sub-pixel during evaporation, a sufficient distance needs to be kept between the sub-pixel and the bridge. Consequently, a vertical length of the sub-pixel is reduced, and an aperture ratio of each sub-pixel is affected. A conventional side-by-side arrangement of RGB pixels can only reach up to 200 to 300 PPI, and it is difficult to achieve a high resolution display effect in this manner. With the increasing demand of users for the resolution of OLED display panel, such a side-by-side arrangement of RGB pixels cannot satisfy a design requirement of a product for a high PPI.

FIG. 3 is a schematic diagram of a pixel arrangement of another OLED display panel in the prior art. As shown in FIG. 3, only the G sub-pixel of each pixel is used separately, and each of the R and B sub-pixels is shared by adjacent pixels. For example, a pixel 201 and a pixel 202 share an R sub-pixel. Although such a method can increase a PPI of a display screen, however in this arrangement, R and B sub-pixels are shared by adjacent pixels, thus a whole display effect may include a distortion and is not a full color display in a real sense.

SUMMARY OF THE INVENTION

A main objective of this application is to provide a pixel structure and an OLED display panel, to resolve problems existing in the prior art.

To achieve the foregoing objective, a first aspect of embodiments of the present application provides a pixel structure, wherein the pixel structure includes a plurality of pixel groups, each of the pixel groups including a first pixel and a second pixel that are adjacent in a first direction and are disposed in a staggered manner in a second direction perpendicular to the first direction.

Each of the first pixel and the second pixel includes sub-pixels of three different colors arranged along the second direction, and a distance between two sub-pixels of a same color respectively of the first pixel and the second pixel in the first direction is equal to that in the second direction.

Optionally, a central line of a first sub-pixel in the second pixel extending along the first direction overlaps with a borderline between a first sub-pixel and a second sub-pixel in the first pixel; or a central line of a first sub-pixel in a first pixel extending along the first direction overlaps a borderline between a first sub-pixel and a second sub-pixel in the second pixel.

Optionally, the first pixel includes a first sub-pixel, a second sub-pixel, and a third sub-pixel that are sequentially arranged along the second direction; and the second pixel includes a third sub-pixel, a first sub-pixel, and a second sub-pixel that are sequentially arranged along the second direction.

Optionally, a length-to-width ratio of an aperture of each of the sub-pixel ranges from 1 to 1.5.

Optionally, in the second direction, distances between centers of adjacent two sub-pixels are same.

Optionally, a shape and an area of the sub-pixels of a same color in the first pixel is same to that in the second pixel, respectively.

Optionally, the sub-pixels include a red sub-pixel, a green sub-pixel, and a blue sub-pixel.

Optionally, each of a shapes and an area of the sub-pixels in the pixel group is the same.

Optionally, in the pixel group, an area of the red sub-pixel is same to an area of the green sub-pixel, and an area of the blue sub-pixel is larger than the area of the red sub-pixel.

Optionally, the first direction is a row direction, and the second direction is a column direction; or the first direction is a column direction, and the second direction is a row direction.

In addition, to achieve the foregoing objective, a second aspect of the embodiments of the present application provides an OLED display panel, wherein the OLED display panel includes any pixel structure according to the first aspect.

The pixel structure and OLED display panel provided by the embodiments of this application can achieve a full-color display in a real sense, and are compactly arranged so as to reduce a spacing between pixels, thus, an increased PPI is achieved by the following features: the first pixel and the second pixel are adjacently arranged along the first direction and each includes sub-pixels of three different colors; the sub-pixels are sequentially arranged along the second direction; a central line of the third sub-pixel in the second pixel extending along the first direction overlaps a borderline between the first sub-pixel and the second sub-pixel in the first pixel; a distance between two sub-pixels of a same color respectively of the first pixel and the second pixel in the first direction is equal to that in the second direction. By sharing adjacent sub-pixels, one pixel can present a display effect of two pixels, thereby further improving display resolution of a screen and a manufacturing yield, and reducing difficulties in an evaporation mask manufacturing process and an evaporation process.

DETAILED DESCRIPTION

Figure 1:
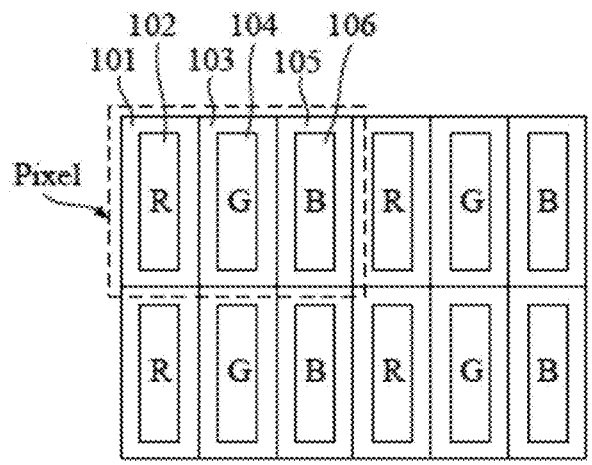
FIG. 1 is a schematic diagram of pixel arrangement of an OLED display panel in the prior art.
Figure 2:
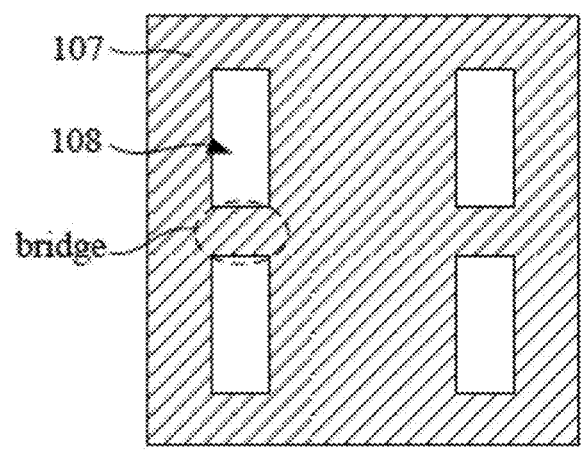
FIG. 2 is schematic diagram of an FMM corresponding to FIG. 1.
Figure 3:
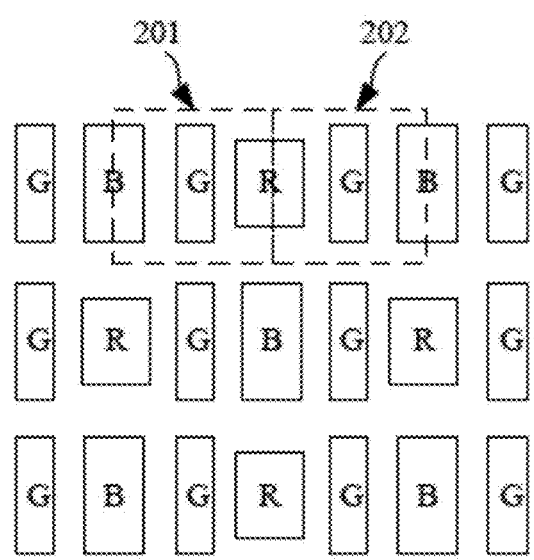
FIG. 3 is a schematic diagram of pixel arrangement of another OLED display panel in the prior art.

This application is described in further detail by referring to the accompanying drawings. In the respective accompanying drawings, same elements are represented by using similar reference signs. For clearness, respective parts in the accompanying drawings are not drawn proportionally. In addition, some well-known parts are not shown in the drawings.

First Embodiment

This embodiment is described below with reference to FIG. 4 to FIG. 6, where a first direction is an X direction (also referred to as a row direction or a horizontal direction), a second direction is a Y direction (also referred to as a column direction or a vertical direction), and the first direction is perpendicular to the second direction. For brevity, the accompanying drawings merely show a part of a pixel structure. In an actual product, a quantity of pixels is not limited thereto, and the quantity of pixels may be varied correspondingly according to an actual display requirement. The first row, second row, first column, second column, and the like in this application are used for describing this application by using illustrations in the drawings as reference standards, and do not refer to rows and columns in an actual product.

It should be noted that in this embodiment, the first direction and the second direction do not need to be perpendicular to each other. For convenience, descriptions are provided below by using a case in which the first direction and the second direction are perpendicular to each other.

Figure 4:
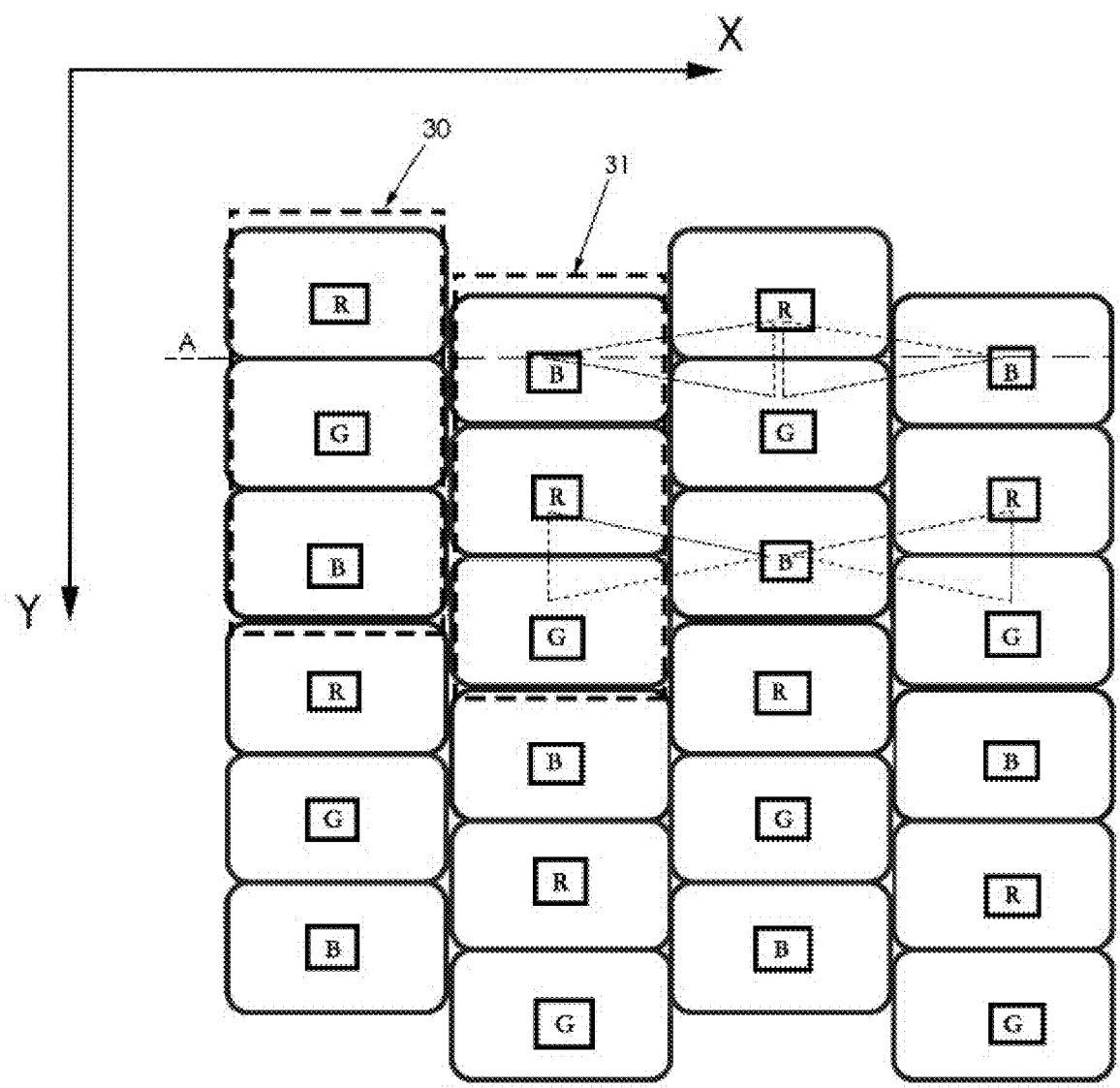
FIG. 4 is a schematic diagram of a pixel structure according to an embodiment of this application.
Figure 5:
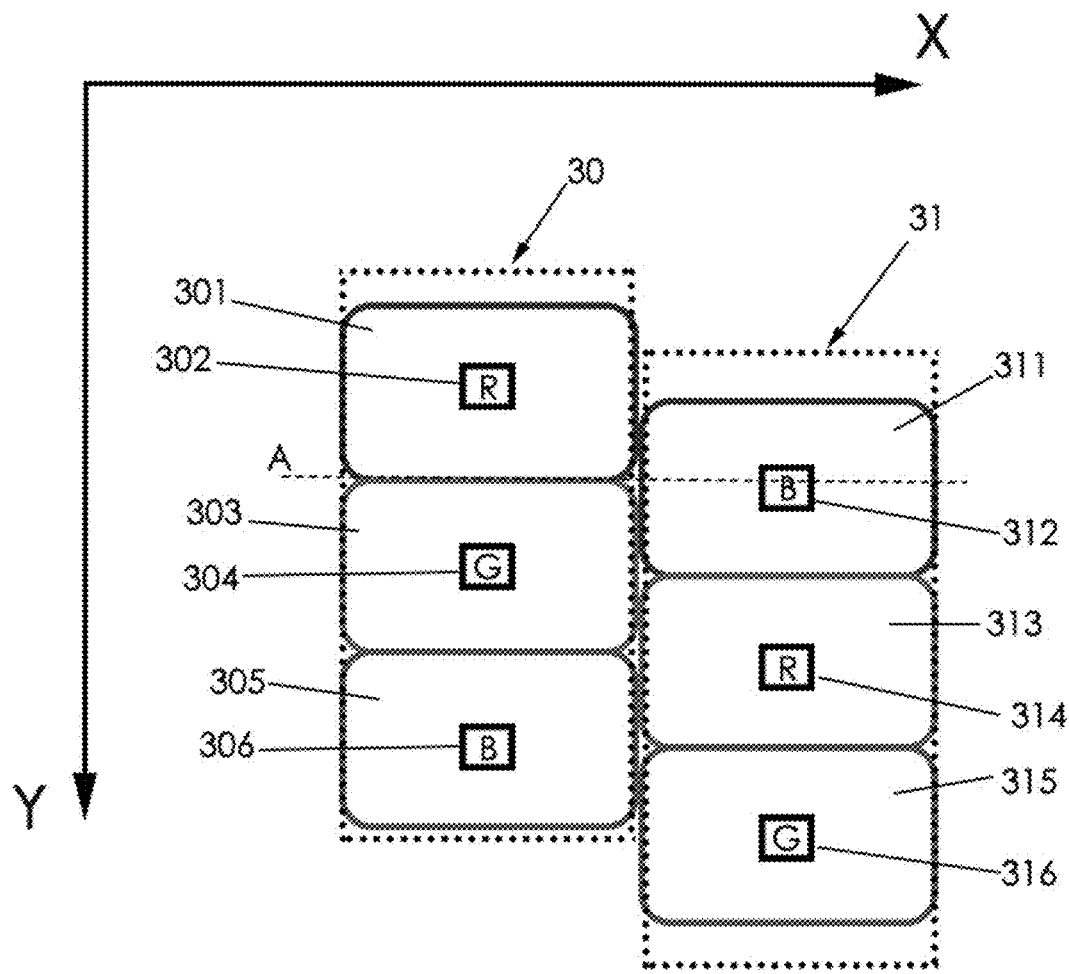
FIG. 5 is a schematic structural diagram of a pixel group in a pixel structure according to an embodiment of this application.

As shown in FIG. 4 and FIG. 5, a pixel structure provided by a first embodiment of this application includes a plurality of pixel groups, each of the pixel groups including a first pixel 30 and a second pixel 31 that are arranged adjacent in a first direction and are disposed in a staggered manner in a second direction, and each of the first pixel 30 and the second pixel 31 comprising sub-pixels of three different colors. A central line of the first sub-pixel (the sub-pixel located at an uppermost position) in the second pixel 31 extending along the first direction overlaps a borderline between the first sub-pixel and the second sub-pixel (the sub-pixel located at a middle position) in the first pixel 30.

Figure 9A:
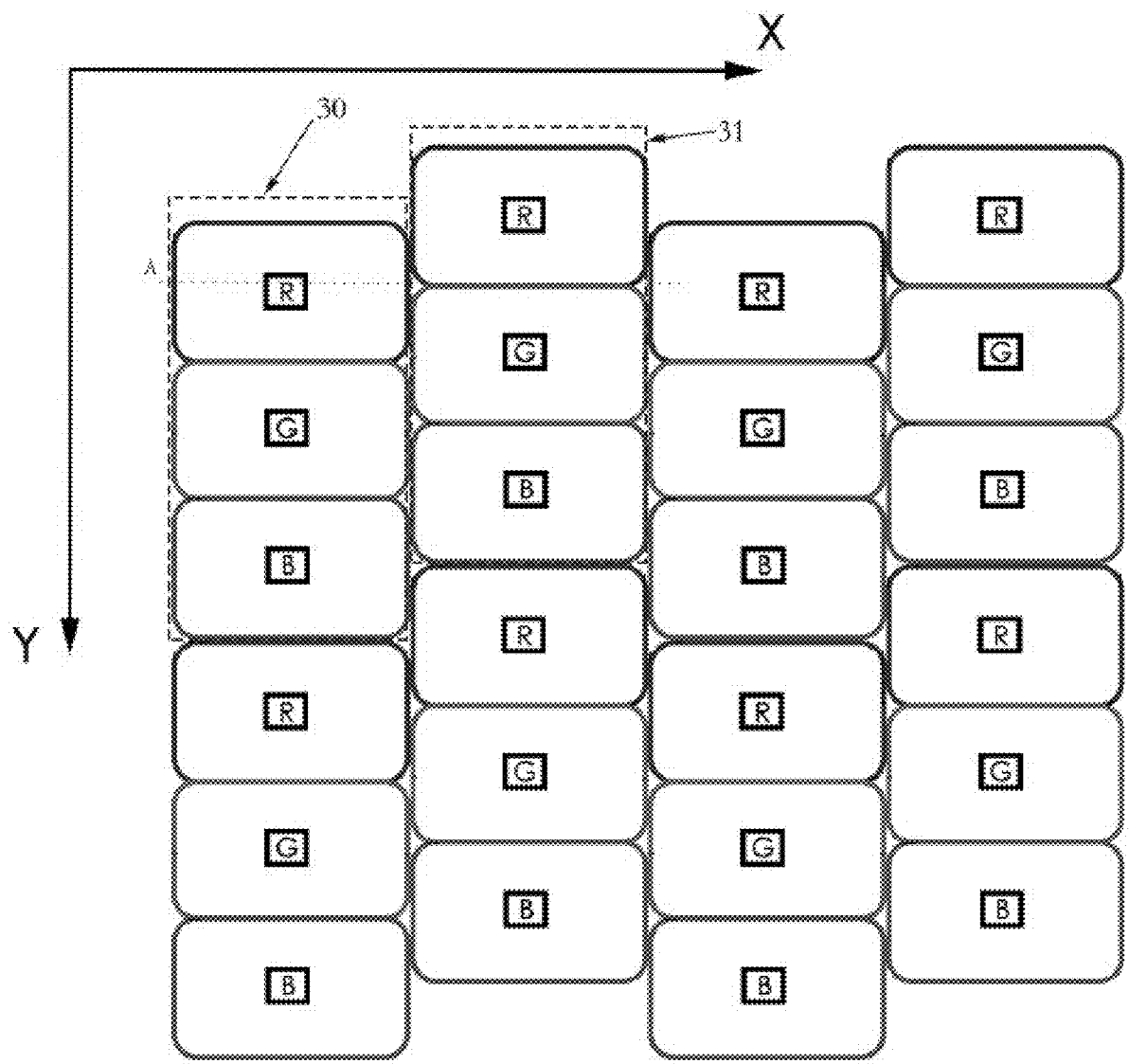
FIG. 9a is a schematic diagram of another pixel structure according to an embodiment of this application.
Figure 9B:
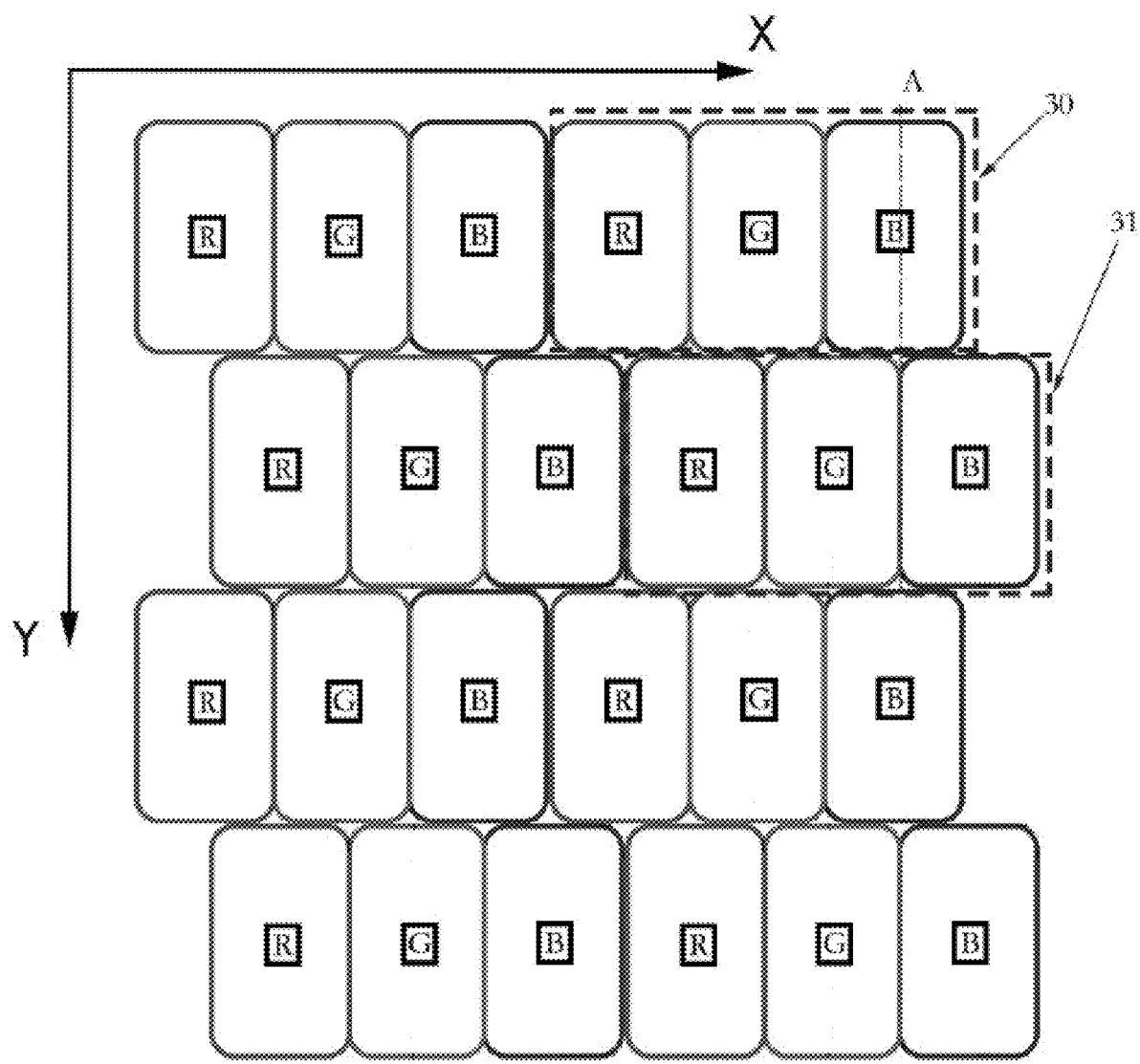
FIG. 9b is another schematic diagram of another pixel structure according to an embodiment of this application.

Referring to FIG. 9a and FIG. 9b, in another embodiment, a central line of the first sub-pixel in the first pixel 30 extending along the first direction overlaps a borderline between the first sub-pixel and the second sub-pixel in the second pixel 31.

The first pixel 30 includes a first sub-pixel 301, a second sub-pixel 303, and a third sub-pixel 305 that are sequentially arranged along the second direction. The second pixel 31 includes a third sub-pixel 311, a first sub-pixel 313, and a second sub-pixel 315 that are sequentially arranged along the second direction.

It should be noted that in this embodiment, arrangement structures of sub-pixels in the first pixel 30 and the second pixel 31 are not limited to the configurations in FIG. 4 to FIG. 8. An sub-pixel arrangement may include various permutations and combinations. For example, FIG. 9a and FIG. 9b show a configuration different from a configuration of FIG. 4. For convenience in description, sub-pixel arrangement structures of FIG. 4 to FIG. 8 are used for description below.

In this embodiment, a shape of each of the sub-pixels may be a rectangle or an oblong. No limitation is imposed in this embodiment.

In this embodiment, the first sub-pixel, the second sub-pixel, and the third sub-pixel in each of the first pixel 30 and the second pixel 31 include a red (R) sub-pixel, a green (G) sub-pixel, and a blue (B) sub-pixel. That is, in the embodiment of this application, the first sub-pixel is one of the red (R) sub-pixel, the green (G) sub-pixel, and the blue (B) sub-pixel; the second sub-pixel is one of the red (R) sub-pixel, the green (G) sub-pixel, and the blue (B) sub-pixel; the third sub-pixel is one of the red (R) sub-pixel, the green (G) sub-pixel, and the blue (B) sub-pixel. Colors of the first sub-pixel, the second sub-pixel, and the third sub-pixel are different from one another.

Using FIG. 5 as an example, in the first pixel 30, the first sub-pixel 301 is the red (R) sub-pixel, the second sub-pixel 303 is the green (G) sub-pixel, and the third sub-pixel 305 is the blue (B) sub-pixel. Therefore, the first sub-pixel 301 includes a red (R) light-emitting region 302 and a red (R) non-light-emitting region (not numbered in the figure), and includes an organic emission layer for emitting red light. The second sub-pixel 303 includes a green (G) light-emitting region 304 and a green (G) non-light-emitting region (not numbered in the figure), and includes an organic emission layer for emitting green light. The third sub-pixel 305 includes a blue (B) light-emitting region 306 and a blue (B) non-light-emitting region (not numbered in the figure), and includes an organic emission layer for emitting blue light. In the second pixel 31, the first sub-pixel 313 is the red (R) sub-pixel, the second sub-pixel 315 is the green (G) sub-pixel, and the third sub-pixel 311 is the blue (B) sub-pixel. Therefore, the first sub-pixel 313 includes a red (R) light-emitting region 314 and a red (R) non-light-emitting region (not numbered in the figure), and includes an organic emitting layer for emitting red light. The second sub-pixel 315 includes a green (G) light-emitting region 316 and a green (G) non-light-emitting region (not numbered in the figure), and includes an organic emitting layer for emitting green light. The third sub-pixel 311 includes a blue (B) light-emitting region 312 and a blue (B) non-light-emitting region (not numbered in the figure), and includes an organic emitting layer for emitting blue light.

A central line (shown by A in FIG. 4 and FIG. 5) of the third sub-pixel 311 in the second pixel 31 extending along the first direction overlaps a borderline between the first sub-pixel 301 and the second sub-pixel 303 in the first pixel 30.

It should be noted that because in the first pixel 30, the first sub-pixel 301 and the second sub-pixel 303 share one side, thus, the shared side is the borderline between the first sub-pixel 301 and the second sub-pixel 303. However, it should be understood that the "border" or "borderline" described herein does not define a physical "border" or "borderline", but may refer to a virtual "border" or "borderline" between two sub-pixels in a pixel.

A distance between two sub-pixels of a same color that respectively of the first pixel 30 and the second pixel 31 in the first direction is equal to that in the second direction. That is, a distance between two sub-pixels of a same color in a pixel group in the first direction is equal to that in the second direction.

Figure 6:
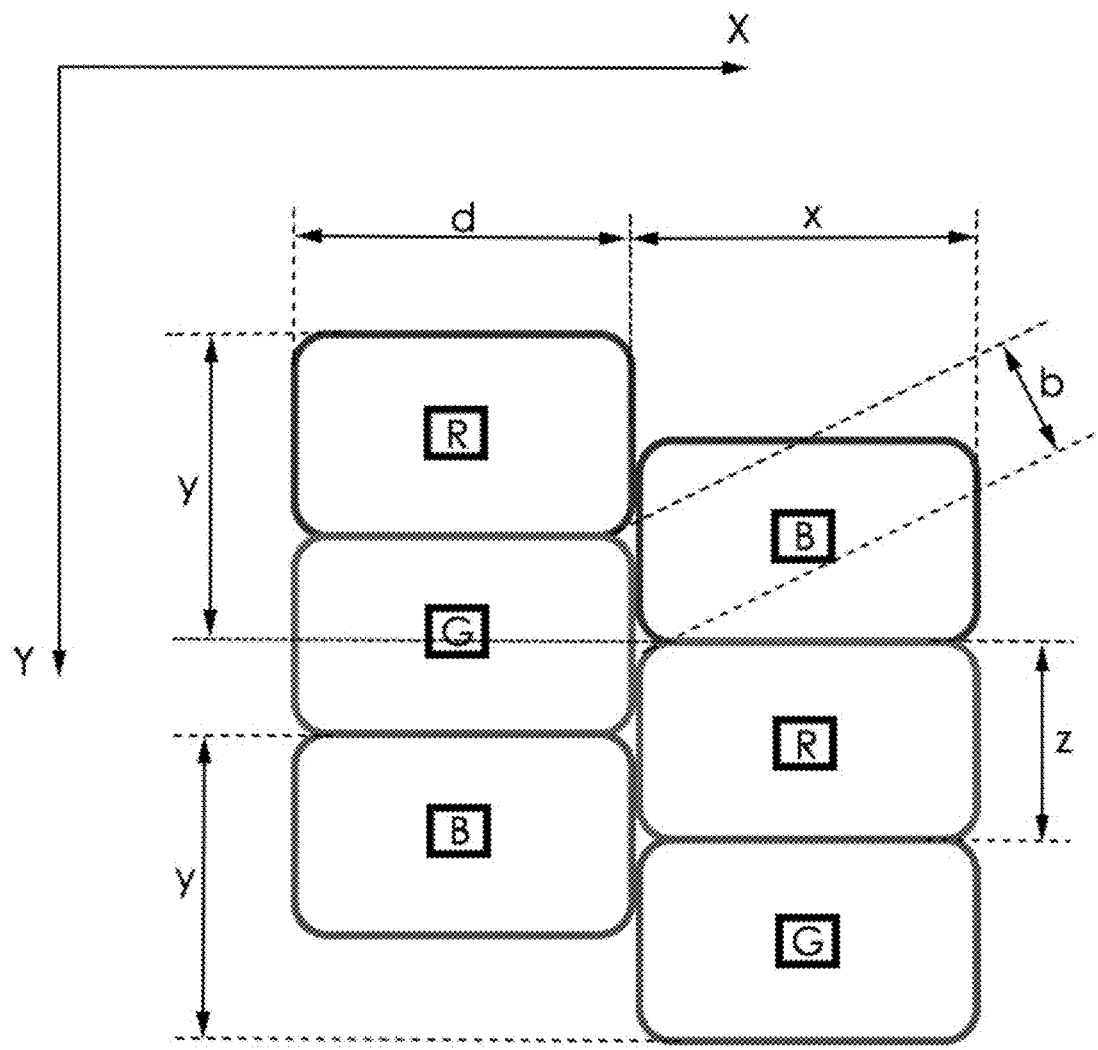
FIG. 6 is a schematic structural diagram of pixel group having different pixel aperture length-to-width ratios in a pixel structure according to an embodiment of this application.

Using FIG. 6 as an example, a distance between an R sub-pixel of a first column and an R sub-pixel in a second column is x in a row direction and is y in a column direction, where x is equal to y. A distance between a G sub-pixel in the first column and a G sub-pixel in the second column is x in the row direction and is y in the column direction, where x is equal to y. A configuration of a B sub-pixel is similar to the above (not shown in the figure), and details are not described herein again. By using such a pixel arrangement, the pixels can be arranged more compactly, a spacing between pixels is reduced, and thus a PPI is increased.

In this embodiment, each of the pixels includes RGB three-color sub-pixels, and can achieve a full color display in a real sense. On the other hand, the pixel may be applied to a display panel with a resolution that is the same in the first direction and in the second direction or a display panel with a resolution that is different in the first direction and in the second direction. In a manner of sharing a sub-pixel by adjacent pixels, a pixel may present a display effect of two pixels, thereby further improving a virtual display resolution of a screen. Using the original resolution n as an example, by sharing in the first direction, the resolution of the pixel arrangement can be doubled to 2n. For a sharing manner, refer to dashed-line triangles in FIG. 4. For example, in FIG. 4, an R sub-pixel and a G sub-pixel in a third column are shared by B sub-pixels that are adjacent to the R sub-pixel and the G sub-pixel, in a second column and a fourth column. A B sub-pixel of the third column is shared by R sub-pixels and G sub-pixels that are adjacent to the B sub-pixel, in the second column and the fourth column.

In an embodiment, value ranges of respective aperture length-to-width ratios of two sub-pixels of a same color respectively of the first pixel 30 and the second pixel 31 are 1 to 1.5.

Figure 7:
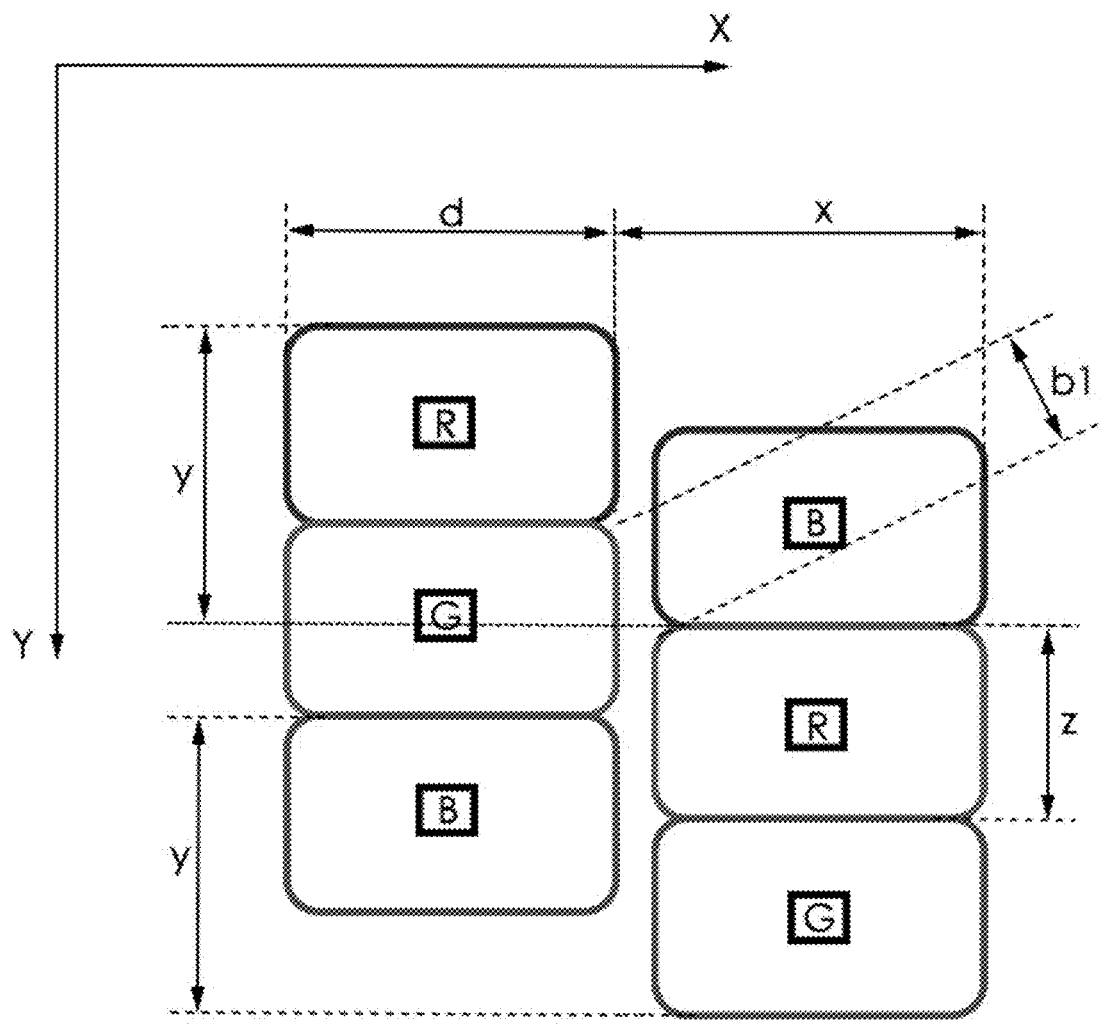
FIG. 7 is another schematic structural diagram of pixel group having different pixel aperture length-to-width ratios in a pixel structure according to an embodiment of this application.

Please refer to FIG. 6 and FIG. 7, an aperture length-to-width ratio of an R sub-pixel is d:z, where a value range of d:z is 1 to 1.5. Configurations of a G sub-pixel and a B sub-pixel are similar to the R sub-pixel. Details are not described herein again. When an aperture length-to-width ratio of a sub-pixel is 1.5, a design margin that can be satisfied is relatively large. A bridge (as shown by b in FIG. 6 and b1 in FIG. 7) between sub-pixels of a same color may alternatively be adjusted by adjusting a length-to-width ratio. An increase of a value of the bridge can improve a mechanical stability, reduce difficulties in manufacturing process and evaporation process of a fine metal mask, and thus a manufacturing yield can be increased. Using FIG. 6 and FIG. 7 as examples, a bridge value b1 in FIG. 7 is greater than a bridge value b in FIG. 6. Therefore, compared with FIG. 6, FIG. 7 has a higher mechanical stability, less difficulties in manufacturing process and evaporation process of a fine metal mask, and a higher manufacturing yield.

In an embodiment, in the second direction, a distance between centers of two adjacent sub-pixels is the same. The embodiment can enable the pixels to be arranged more compactly, reduce a spacing between pixels, and thus a PPI is increased.

In an embodiment, shapes and areas of two sub-pixels of a same color respectively of the first pixel 30 and the second pixel 31 are both the same. Since all sub-pixels of a same color have a same shape and a same area, manufacturing process and evaporation process difficulties for a metal mask can be further reduced. Further, shapes and areas of all sub-pixels in the pixel group may also be maintained the same.

Because the B sub-pixel has the lowest light-emitting efficiency, in the pixel group of another embodiment, an area of the red sub-pixel may be the same as an area of the green sub-pixel, and an area of the blue sub-pixel may be larger than an area of the red sub-pixel.

Second Embodiment

A second embodiment of the present application provides an OLED display panel. The OLED display panel includes the pixel structure according to the first embodiment.

The first embodiment may be referred to for the pixel structure. Details are not described herein again.

Figure 8:
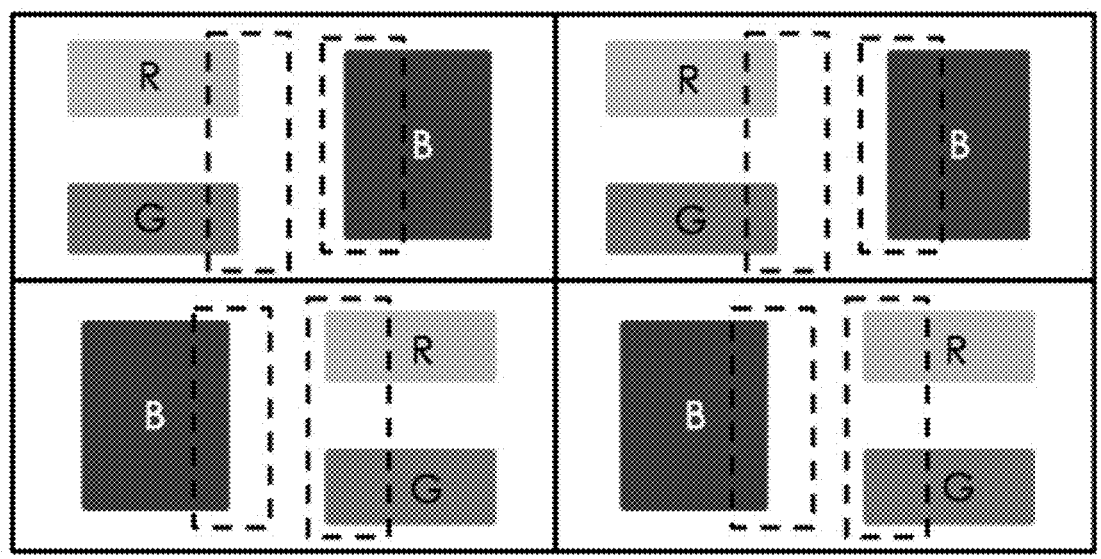
FIG. 8 is a schematic diagram of display of a pixel structure according to an embodiment of this application.

To further describe this embodiment, a display solution of a pixel structure in an OLED display panel is described with reference to FIG. 8:

As shown in FIG. 8, in a row direction, a length-to-width ratio of a real pixel may be 2:1. The sub-pixels of each column correspondingly display a column of pixels. Two display driving methods may be used as follows:

A first display driving method is not displaying parts of RGB sub-pixels of a corresponding image located in a dashed-line box.

A second display driving method is displaying parts of RGB sub-pixels of a corresponding image located in a dashed-line box at a small proportion (for example, 30%) of brightness and displaying parts of RGB sub-pixels of a corresponding image not located in the dashed-line box at a large proportion (for example, 70%) of brightness. In this way, not only a brightness difference between horizontally adjacent columns can be ensured, but also display of a single point is not excessively distorted. Certainly, the brightness display proportions may be half and half (that is, the parts of the sub-pixels located in the dashed-line box are displayed at 50% of the brightness, and the parts of the sub-pixels not located in the dashed-line box are displayed at 50% of the brightness). In this way, adjacent two columns have the same brightness, thereby display details are blurred. This method is applicable to a high-PPI display.

The embodiments according to this application are described above. All details of the embodiments are not described specifically, and this application is not limited to merely the specific embodiments either. Obviously, according to the descriptions above, many modifications and changes may be made. The embodiments that are selected and specifically described in this description are used for better explaining the principle and actual application of this application, so as to enable of a person skilled in the art to favorably use this application and modifications based on this application. This application is only limited by the claims and all scopes and equivalents of the claims.

What is claimed is:

1. A pixel structure, comprising:
    a plurality of pixel groups, each of the pixel groups including a first pixel and a second pixel adjacent in a first direction and disposed in a staggered manner in a second direction perpendicular to the first direction,
    each of the first pixel and the second pixel including sub-pixels of three different colors arranged along the second direction, wherein a shape and an area of the sub-pixels in the pixel group are respectively the same, and in each of the first pixel and the second pixel, adjacent sub-pixels share one side which defines a borderline between the adjacent sub-pixels, and
    wherein a distance between two sub-pixels of a same color respectively of the first pixel and the second pixel in the first direction is equal to that in the second direction.

2. The pixel structure according to claim 1, wherein a central line of a first sub-pixel in the second pixel extending along the first direction overlaps with the borderline between a first sub-pixel and a second sub-pixel in the first pixel; or
    a central line of a first sub-pixel in the first pixel extending along the first direction overlaps the borderline between a first sub-pixel and a second sub-pixel in the second pixel.

3. The pixel structure according to claim 1, wherein the first pixel includes a first sub-pixel, a second sub-pixel, and a third sub-pixel sequentially arranged along the second direction; and
    the second pixel includes a third sub-pixel, a first sub-pixel, and a second sub-pixel sequentially arranged along the second direction.

4. The pixel structure according to claim 1, wherein a length-to-width ratio of an aperture of each of the sub-pixels ranges from 1 to 1.5.

5. The pixel structure according to claim 1, wherein in the second direction, distances between centers of adjacent two sub-pixels are same.

6. The pixel structure according to claim 1, wherein a shape and an area of the sub-pixels of a same color in the first pixel is same to that in the second pixel, respectively.

7. The pixel structure according to claim 1, wherein the sub-pixels include a red sub-pixel, a green sub-pixel, and a blue sub-pixel.

8. The pixel structure according to claim 1, wherein the first direction is a row direction and the second direction is a column direction; or
    the first direction is a column direction and the second direction is a row direction.

9. An Organic Light-Emitting Diode (OLED) display panel comprising the pixel structure according to claim 1.

10. The pixel structure according to claim 1, wherein in each of the pixel groups, the first pixel and the second pixel are separated in the first direction by a spacing.

11. The pixel structure according to claim 1, wherein in each of the pixel groups, the first pixel and the second pixel are staggered in the second direction by half a size of one sub-pixel in the second direction.

12. The pixel structure according to claim 1, wherein the distance between two sub-pixels of the same color respectively of the first pixel and the second pixel in each of the first and second directions is 1.5 times a size of one sub-pixel in the second direction.

* * * * *